United States Patent
Marzaki (10) Patent No.: US 10,879,233 B2
(45) Date of Patent: Dec. 29, 2020

(54) PROCESS FOR FABRICATING CAPACITIVE ELEMENTS IN TRENCHES

(71) Applicant: STMicroelectronics (Rousset) SAS, Rousset (FR)

(72) Inventor: Abderrezak Marzaki, Aix en Provence (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 0 days.

(21) Appl. No.: 16/111,716

(22) Filed: Aug. 24, 2018

(65) Prior Publication Data
US 2019/0067274 A1    Feb. 28, 2019

(30) Foreign Application Priority Data
Aug. 28, 2017    (FR) ...................................... 1757906

(51) Int. Cl.
*H01L 27/06* (2006.01)
*H01L 29/78* (2006.01)
(Continued)

(52) U.S. Cl.
CPC ........ *H01L 27/0629* (2013.01); *H01L 21/283* (2013.01); *H01L 21/306* (2013.01); *H01L 21/76224* (2013.01); *H01L 27/11521* (2013.01); *H01L 28/40* (2013.01); *H01L 29/4236* (2013.01); *H01L 29/66181* (2013.01); *H01L 29/66825* (2013.01); *H01L 29/7827* (2013.01); *H01L 29/945* (2013.01)

(58) Field of Classification Search
CPC . H01L 29/66181; H01L 29/945; H01L 28/40; H01L 21/76224
See application file for complete search history.

(56) References Cited

U.S. PATENT DOCUMENTS 5,581,110 A    12/1996  Razouk et al.
5,805,494 A     9/1998  El-Kareh et al.
(Continued)

FOREIGN PATENT DOCUMENTS

EP    1335425 A1    8/2003
FR    2894708 A1    6/2007
(Continued)

OTHER PUBLICATIONS

La Rosa, F., et al.: "40nm Embedded Select in Trench Memory (eSTM) Technology Overview," 2019 IEEE 11th International Memory Workshop, 4 pages.
(Continued)

*Primary Examiner* — Bilkis Jahan
*Assistant Examiner* — Victor V Barzykin
(74) *Attorney, Agent, or Firm* — Crowe & Dunlevy (57) ABSTRACT

A capacitive element is fabricated by forming a sacrificial trench isolation and directionally etching through the sacrificial trench isolation and into an underlying semiconductor substrate to form an electrode trench. The electrode trench is then clad with an insulating material and filled with a conductive material. The conductive fill provided one capacitor electrode and the semiconductor substrate forms another capacitor electrode, with the insulating material cladding forming the capacitor dielectric layer.

20 Claims, 4 Drawing Sheets

(51) Int. Cl.
*H01L 21/762* (2006.01)
*H01L 27/11521* (2017.01)
*H01L 21/283* (2006.01)
*H01L 29/423* (2006.01)
*H01L 29/66* (2006.01)
*H01L 21/306* (2006.01)
*H01L 29/94* (2006.01)
*H01L 49/02* (2006.01)

(56) References Cited

U.S. PATENT DOCUMENTS

| | | | |
|---|---|---|---|
| 6,391,707 | B1 | 5/2002 | Dirnecker et al. |
| 7,449,744 | B1 | 11/2008 | Yu et al. |
| 8,085,524 | B2 | 12/2011 | Roozeboom et al. |
| 8,492,820 | B2 | 7/2013 | Anderson et al. |
| 8,525,245 | B2 | 9/2013 | Erickson et al. |
| 8,816,470 | B2 | 8/2014 | Erickson et al. |
| 9,159,723 | B2 | 10/2015 | Chou et al. |
| 9,178,080 | B2 | 11/2015 | Kalnitsky et al. |
| 9,349,793 | B2 | 5/2016 | Jaffe et al. |
| 9,978,829 | B2 | 5/2018 | Lin |
| 10,049,890 | B2 | 8/2018 | Chou et al. |
| 10,084,035 | B2 | 9/2018 | Papavasiliou et al. |
| 10,109,601 | B2 | 10/2018 | Marzaki |
| 2007/0054461 | A1* | 3/2007 | Su .............. H01L 27/1087 438/386 |
| 2007/0278612 | A1 | 12/2007 | Williams et al. |
| 2009/0039466 | A1* | 2/2009 | Sanada ............ H01L 28/82 257/532 |
| 2011/0018094 | A1 | 1/2011 | Chapman et al. |
| 2012/0032260 | A1 | 2/2012 | Hirler et al. |
| 2013/0069198 | A1 | 3/2013 | Claeys et al. |
| 2013/0161792 | A1 | 6/2013 | Tran et al. |
| 2014/0145299 | A1* | 5/2014 | Kalnitsky ........ H01L 29/945 257/532 |
| 2014/0264523 | A1 | 9/2014 | Loechelt et al. |
| 2015/0061075 | A1* | 3/2015 | Yeh ............ H01L 21/76877 257/532 |
| 2015/0236031 | A1 | 8/2015 | Mantelli et al. |
| 2016/0020267 | A1 | 1/2016 | Lin |
| 2016/0218071 | A1 | 7/2016 | Nam et al. |

FOREIGN PATENT DOCUMENTS

| | | |
|---|---|---|
| FR | 3013148 A1 | 5/2015 |
| FR | 3021457 A1 | 11/2015 |

OTHER PUBLICATIONS

INPI Search Report and Written Opinion for FR 1757906 dated May 3, 2014 (14 pages).

* cited by examiner

PROCESS FOR FABRICATING CAPACITIVE ELEMENTS IN TRENCHES

PRIORITY CLAIM

This application claims the priority benefit of French Application for Patent No. 1757906, filed on Aug. 28, 2017, the content of which is hereby incorporated by reference in its entirety to the maximum extent allowable by law.

TECHNICAL FIELD

Embodiments of the invention relate to the fabrication of integrated circuits and in particular to processes for fabricating capacitive elements.

BACKGROUND

Capacitive elements, such as charge-storage capacitors, are generally bulky components in integrated-circuit architectures.

Moreover, integrated-circuit component fabricating process steps are generally many in number and expensive, and it is constraining to implement steps dedicated solely to the fabrication of a single element or of a single type of element.

Thus, it would be desirable to increase the capacitance per unit area of integrated-circuit capacitive-element architectures, and to implement their fabricating steps conjointly with the production of other components of the integrated circuit.

SUMMARY

In this context, a process is provided for fabricating a capacitive element in a semiconductor substrate, comprising: forming at least one sacrificial trench isolation in the substrate, the formation of this at least one sacrificial trench isolation including etching at least one trench, and filling this at least one trench with a dielectric material; forming respectively at least one electrode trench, the formation of this at least one electrode trench comprising a directional etch that is configured to etch the semiconductor substrate, the directional etch being aligned with said at least one sacrificial trench isolation and continuing depthwise to a portion of the substrate which is located under said at least one sacrificial trench isolation; forming an insulating cladding on the flanks and bottom of said at least one electrode trench and filling a central section clad with said insulating cladding with a conductive material; the conductive material of the central section thus forming at least one first portion of a first electrode of the capacitive element, the substrate thus forming at least one second portion of a second electrode of the capacitive element and the insulating cladding thus forming at least one third portion of a dielectric region of the capacitive element.

In other words, the process uses a directional etching technique intended to etch the semiconductor material of the substrate in trenches filled with a dielectric material. The result of this is to form a deeper etch than the etch in the substrate, for which etch said directional etch is intended.

The process thus allows the area of the electrodes of a capacitive element to be increased without adding any additional steps to the techniques conventionally used to fabricate integrated-circuit elements (such as a buried transistor or a shallow trench isolation) or increasing occupancy of substrate-surface real estate.

According to one implementation, said at least one sacrificial trench isolation has a first width level with a first side of the substrate and said directional etch is carried out to a second width, level with the first side, larger than the first width.

According to one implementation, said at least one sacrificial trench isolation is formed conjointly with shallow trench isolations intended to laterally isolate surfacewise a well contained in the substrate.

According to one implementation, said directional etch is implemented conjointly with an etch of trenches intended to accommodate vertical gates of buried transistors.

According to one implementation, said etch of trenches intended to accommodate vertical gates of buried transistors is carried out in the semiconductor substrate.

According to one implementation, said insulating cladding is formed conjointly with a deposition of a layer of gate oxide of said buried transistors.

According to one implementation, said central section of said at least one electrode trench is filled and said vertical gates of buried transistors are filled with a gate material, conjointly.

According to one implementation, the fabrication of the capacitive element furthermore comprises: forming a first insulating layer on the first side above said at least one trench; forming a first conductive layer on the first insulating layer; forming a second insulating layer on the first conductive layer; forming a second conductive layer on the second insulating layer; electrically coupling or connecting the first conductive layer to the conductive material filling said central section, conjointly forming the first electrode; and electrically coupling or connecting the second conductive layer to the substrate, conjointly forming the second electrode; the first insulating layer and the second insulating layer thus forming, conjointly with the insulating cladding, said dielectric region of the capacitive element.

According to one implementation: the first insulating layer is formed conjointly with a layer of tunnel oxide of a floating-gate transistor; the first conductive layer is formed conjointly with a polysilicon layer of a floating gate of the floating-gate transistor; the second insulating layer is formed conjointly with an oxide layer of a control gate of the floating-gate transistor; the second conductive layer is formed conjointly with a polysilicon layer of the control gate of the floating-gate transistor.

According to one implementation, said directional etch is configured to etch the substrate to a first depth from the first side, and to etch said at least one electrode trench to a second depth from the first side, the second depth being equal to at least 125% of the first depth.

According to another aspect, an integrated circuit is provided comprising, in a zone of a semiconductor substrate of a first conductivity type, at least one transistor with a vertical gate comprising at least one first trench including a central section filled with an electrically conductive gate material clad with a cladding of gate dielectric and extending vertically into said zone of the substrate from a first side to a first depth, and at least one capacitive element comprising at least one second trench including a central section filled with an electrically conductive electrode material clad with an insulating cladding and extending vertically into said zone of the substrate from a first side to a second depth that is larger than the first depth, wherein said electrically conductive electrode material is the same material as the electrically conductive gate material, and said insulating cladding is formed from the same material as said cladding of gate dielectric.

For example, the second depth is 1.25 to 2 times deeper than the first depth.

According to one embodiment, said insulating cladding has a thickness equal to the thickness of said cladding of gate dielectric.

According to one embodiment in which said zone of the substrate is a semiconductor well of the first conductivity type, isolated from the rest of the substrate by a buried semiconductor layer of a second conductivity type opposite the first conductivity type, the bottom of said at least one first trench does not reach the buried layer and the bottom of said at least one second trench reaches the buried layer.

BRIEF DESCRIPTION OF THE DRAWINGS

Other advantages and features of the invention will become apparent on examining the detailed description of completely non-limiting implementations and the appended drawings, in which.

DETAILED DESCRIPTION

FIGS. 1 to 4 show steps of a process for fabricating in particular a capacitive element produced in a semiconductor substrate PW or in a semiconductor well (referenced by the same reference PW) contained in the substrate.

Figure 1:
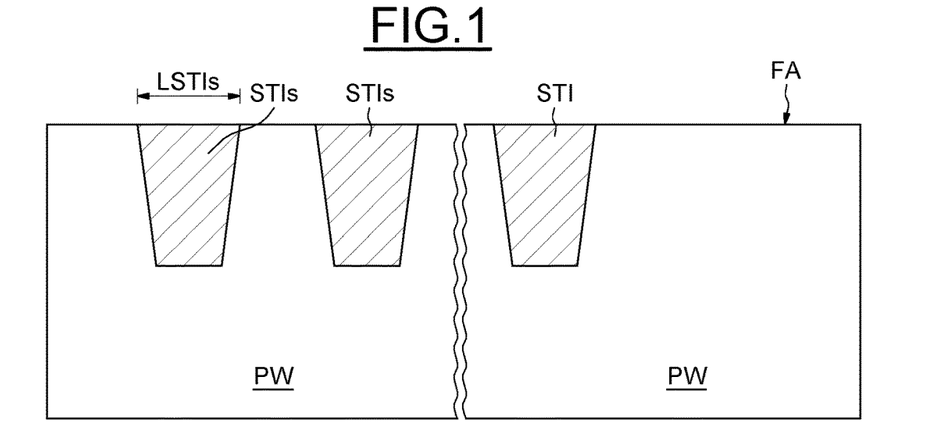
FIGS. 1 to 4 show steps of a process for fabricating in particular a capacitive element.

The left-hand portion of FIG. 1 shows the result of a step of forming sacrificial trench isolations STIs in the substrate PW; the right-hand portion of FIG. 1 shows the result of a step of forming shallow trench isolations STI.

The sacrificial trench isolations STIs are shallow trench isolations (STI's). Processes for fabricating shallow trench isolations (STI's) are conventional and usual in the design of integrated circuits.

Thus, the step of forming sacrificial trench isolations STIs is advantageously implemented conjointly with the step of forming shallow trench isolations STI, which step is moreover required to fabricate the integrated circuit.

The expression "steps implemented conjointly" is understood to mean that the fabricating process implemented in these steps is common. Specifically, fabricating processes such as etches, implantations or depositions are generally applied to the entire surface of the substrate, masking allowing zones of interest of said surface to be exposed at will. Thus, a common step may allow various structures intended for various functions to be formed conjointly in various zones of the substrate and of its surface.

Figure 2:
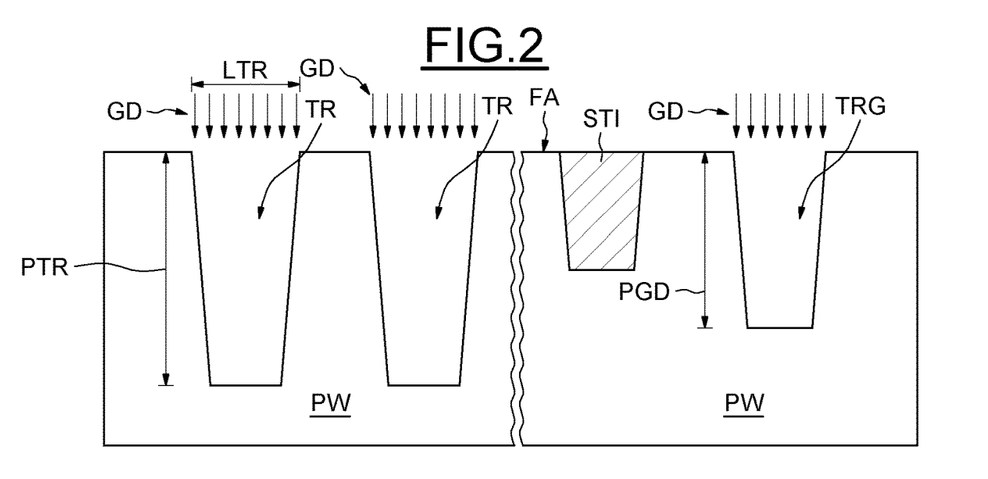

FIG. 2 shows the result of a directional (or anisotropic) etching step GD.

The directional etch GD is configured to etch in the vertical direction the semiconductor material of the substrate, for example silicon that is doped p-type, to a first depth PGD.

For example, the directional etch GD is a dry anisotropic plasma etch such as a reactive-ion etch (RIE).

This type of etching is more effective on a dielectric material, such as the silicon dioxide filling the shallow trench isolations, than on the silicon of the substrate.

The directional etch GD is applied not only to the substrate PW, for example in order to form a vertical gate of a buried transistor, as shown in the right-hand portion of FIG. 2, but also, at the same time, in a manner which is aligned with the positions of the sacrificial trench isolations STIs, as shown in the left-hand portion of FIG. 2.

As conventional and usual, the zones in which the etch GD is applied are defined by photolithography masking methods, which may easily be modified upstream in the process flow.

Therefore, at the end of the etch GD, when a first depth PGD has been reached, the etch GD of the sacrificial trench isolations STIs has etched not only all of the dielectric material that they contained but also a portion of the substrate, which is located under said sacrificial trench isolations STIs, to a second depth PTR larger than the first depth PGD.

In other words, the directional etch GD is configured to etch, in the substrate PW, a first trench TRG of a first depth PGD, and to etch, in at least one sacrificial trench isolation STIs, and in a portion of the substrate which is located under said at least one sacrificial trench isolation STIs, respectively at least one electrode trench TR of a second depth PTR.

It will be noted that, in order to avoid the presence of dielectric residues on the flanks of the electrode trenches TR, the directional etch GD is carried out to a second width LTR larger than the width LSTIs of the sacrificial trench isolations STIs (said widths in question being measured level with a first side FA of the substrate PW, generally referred to as the "front side").

For example, the first depth PGD is chosen to be suitable for forming a vertical gate of buried transistors and is comprised between 300 nm and 400 nm, from the first side FA.

The depth of a shallow trench isolation STI is, for example, comprised between 200 nm and 300 nm, from the first side FA.

The second depth PTR of the second trenches thus obtained is, for example, comprised between 500 nm and 600 nm, from the first side FA.

Thus, the second depth PTR is in this example 1.25 to 2 times deeper than the first depth PGD.

Figure 3:
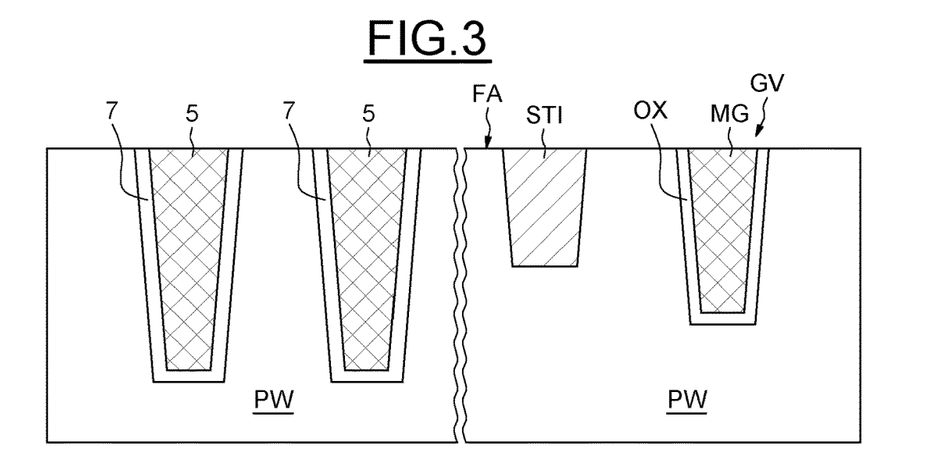

FIG. 3 shows the result of operations for forming a vertical gate type structure of a buried transistor.

An insulating cladding 7 has been formed on the flanks and bottom of the second trenches TR and conjointly, in a common process such as a deposition or growth process, a layer of gate oxide OX has been formed on the flanks and bottom of the first trench.

Likewise, the filling of the central section 5 left vacant in the electrode trenches TR with a conductive material and the filling of the space left vacant in the first trench TRG are achieved with a gate-conductor material MG, for example metal or gate polysilicon.

Usually, chemical mechanical planarization (CMP) is implemented conjointly on the whole surface of the substrate PW.

Thus, in the left-hand portion of FIG. 3, a first electrode of a capacitive element C of high capacitance per unit area has been produced without adding any additional steps to the steps required to fabricate vertical-gate buried transistors.

Figure 4:
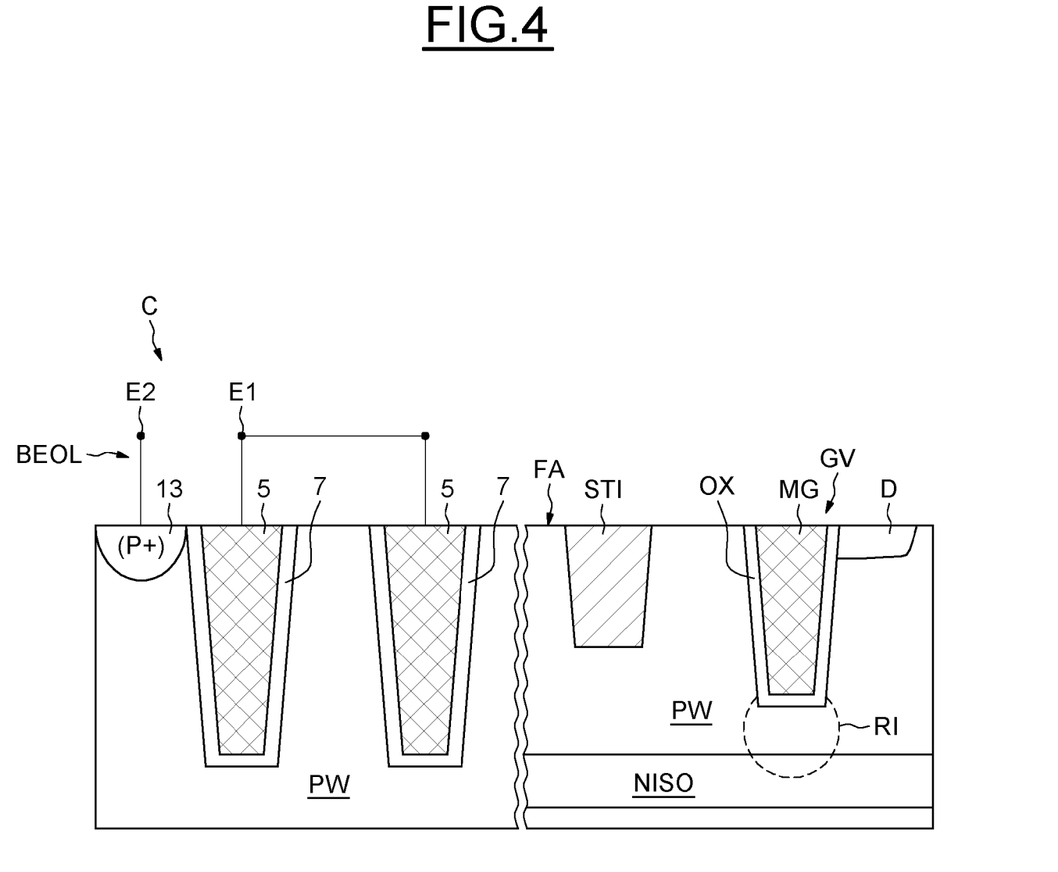

FIG. 4 schematically shows the result of a coupling step in which interconnects are formed, for example in the BEOL interconnect levels of the integrated circuit, forming a first electrode E1 of the capacitive element C, and a second electrode E2 of the capacitive element C.

In this example, the first electrode E1 is formed by electrically connecting the conductive materials deposited in the central sections 5 of the electrode trenches TR etched beforehand.

The second electrode E2 is for its part formed in the substrate PW by producing, in a conventional way, a highly-doped contact-redistribution region 13 that is implanted into the substrate PW level with its first side FA.

Thus, the two electrodes E1, E2 of the capacitive element C are mutually separated by the insulating cladding 7 forming the dielectric region of the capacitive element C.

Moreover, in the right-hand portion of FIG. 4, a region RI implanted in the bottom of the trench TRG was produced before the layer of gate oxide OX and the gate-conductor material MG were deposited.

This implanted region, which is of a second conductivity type opposite that of the substrate PW, allows electrical continuity to be ensured between a buried layer NISO of the second conductivity type, playing the role of source region of the buried transistor TA, and the flanks of the vertical gate GV.

A drain region D of the second conductivity type has moreover been formed level with the first side FA of the substrate PW.

Although not shown in the left-hand portion of FIG. 4, the region of the substrate or well PW accommodating the capacitive element C may also include the buried layer NISO and a region implanted in the bottom of the electrode trenches TR, which are obtained conjointly with the formation of the buried transistor.

Figure 5:
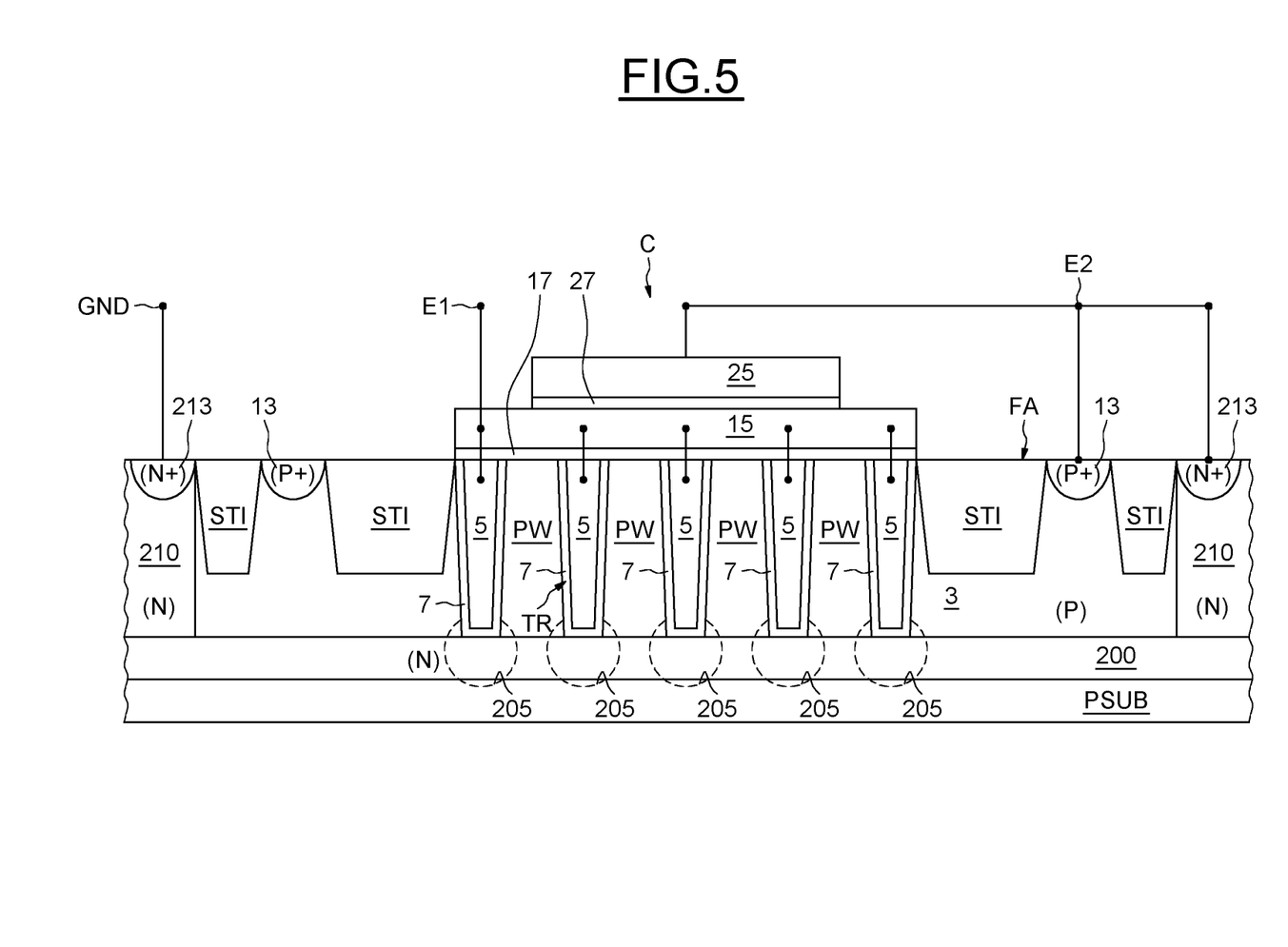
FIG. 5 shows an example of one embodiment of a capacitive element.

FIG. 5 shows an example of one embodiment of a capacitive element C of the same type as that described with reference to FIG. 4.

In this example, the well PW belongs to a triple-well type architecture, i.e. the well is electrically isolated from the substrate PSUB by an isolating layer doped a second conductivity type that is opposite the first conductivity type of the well and of the substrate.

The isolating layer includes a buried layer 200 under the substrate and contact wells 210 extending from the front side FA to the buried layer 200.

Auxiliary contact regions 213 that are highly doped the second conductivity type are formed level with the front side FA in contact segments 210.

The auxiliary contact regions allow a contact of acceptable resistivity to be formed between a terminal, for example a ground terminal GMD intended to receive a reference voltage, and the contact segments 210 and the buried layer 200.

The contact segments 210 and the auxiliary contact regions 213 form a ring (seen from above) and encircle the well PW laterally and longitudinally.

The isolating layer 200, 210, 213 thus forms an auxiliary semiconductor layer that is configured to form a source of minority carriers in the well PW, allowing the capacitive element C to operate in inversion mode.

The contact-redistribution regions 13 that are highly doped the first conductivity type and implanted in the well PW level with the first side FA also form a ring (seen from above) in the interior of the ring formed by the contact segments 210 and the segment-contact regions 213.

The contact-redistribution regions 13 and the auxiliary contact-redistribution regions 213 are both electrically connected or coupled to the second electrode E2.

Moreover, the trenches TR may include an implanted region 205 of the second conductivity type, which region is located between the respective bottoms of the trenches TR and the buried layer 200, allowing electrical continuity to be ensured between the edges of the trenches TR and the buried semiconductor layer 200.

Furthermore, in this example, a stack of a first insulating layer 17, of a first conductive layer 15, of a second insulating layer 27 and of a second conductive layer 25 is formed conjointly with steps of forming a floating-gate transistor—an example result of which is described below with reference to FIG. 6.

This stack is formed on the first side FA of the substrate above said at least one electrode trench TR, and allows the area of the electrodes E1, E2 of the capacitive element C to be increased without increasing footprint on the first side FA. Thus, this stack allows the capacitance per unit area of the capacitive element C to be increased.

The first electrode E1 includes, in this example, the conductive materials deposited in the central sections 5 of said trenches TR, and the first conductive layer 15, and the second electrode includes the well PW and the second conductive layer 25.

The dielectric region of the capacitive element thus includes the insulating cladding 7, the first insulating layer 17 and the second insulating layer 27.

Figure 6:
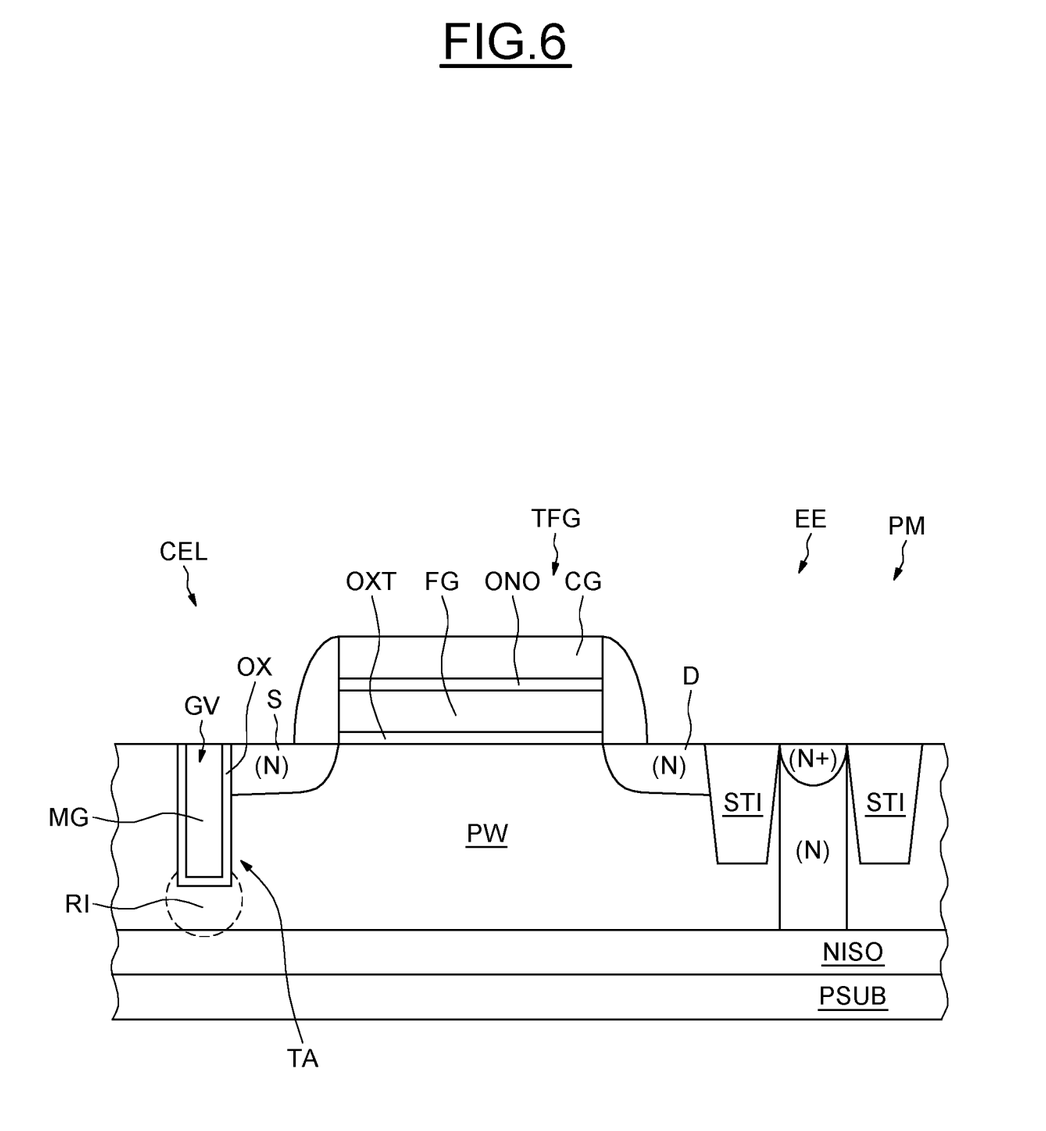
FIG. 6 shows an example of a result of steps for forming a non-volatile memory conjointly with steps to forming the capacitive element.

This example embodiment is in particular compatible with a process for producing a non-volatile memory device EE the memory plane PM of which possesses, as schematically illustrated in FIG. 6, non-volatile memory cells CEL and selection transistors TA.

Each access transistor TA is a buried transistor with a vertical gate GV and is fabricated using the process described above with reference to the right-hand portions of FIGS. 1 to 4.

More precisely, each memory cell CEL includes a floating-gate transistor TFG produced in and on a semiconductor well PW of the first conductivity type, in a triple-well architecture, i.e. the well is separated from the subjacent substrate PSUB of the first conductivity type by a buried semiconductor layer NISO and semiconductor segments NW of the second conductivity type.

Conventionally, each floating-gate transistor TFG includes a doped source region S and a drain region D that are of the second conductivity type, as well as a floating gate FG and a control gate CG that are for example made of polysilicon and mutually separated by a control-gate oxide ONO. The floating gate rests on a tunnel-oxide layer OXT deposited on the surface of the well PW.

Each access transistor TA allows a row of cells to be selected and is a MOS transistor the gate GV of which is a vertical gate in the p-type well, this gate being electrically insulated from this well by a gate oxide OX, typically silicon dioxide. The gate material MG of the vertical gate GV is for example polysilicon.

An implanted region RI of the second conductivity type located between the bottom of the trench accommodating the vertical gate GV and the buried layer NISO allows, with the buried layer NISO, the source region of the access transistor TA to be formed.

The invention is not limited to these embodiments and implementations but encompasses any variant thereof; for example, the process is suitable for producing advantageous capacitive elements such as those of the various embodiments described in the French Application for Patent No. 1757907, filed Aug. 28, 2017, the content of which is incorporated into the present application by reference. Furthermore, such embodiments may, in terms of fabricating steps, be transparent with respect to embodiments other than the memory components such as given by way of example in the present application.

The invention claimed is:

1. A process for fabricating a capacitive element in a semiconductor substrate, comprising:
    forming at least one sacrificial trench isolation in the semiconductor substrate;
    performing a directional etch that is aligned with said at least one sacrificial trench isolation and configured to, in a single plasma etching operation, completely remove insulating material from the at least one sacrificial trench isolation and continue depthwise into a portion of the semiconductor substrate which is located under said at least one sacrificial trench isolation to remove semiconductor material and form at least one electrode trench;
    forming an insulating cladding on the flanks and bottom of said at least one electrode trench; and
    filling a central section clad with said insulating cladding with a conductive material;
    wherein the conductive material of the central section forms at least one first portion of a first electrode of the capacitive element, wherein the semiconductor substrate thus forming at least one second portion of a second electrode of the capacitive element and wherein the insulating cladding forms at least one third portion of a dielectric region of the capacitive element.

2. The process according to claim 1, wherein forming the at least one sacrificial trench isolation comprises: etching at least one first trench, and filling this at least one first trench with a dielectric material.

3. The process according to claim 1, wherein said at least one sacrificial trench isolation has a first width, and wherein said directional etch is carried out to a second width larger than the first width, and wherein said first and second widths extends at a same level as a first side of the semiconductor substrate.

4. The process according to claim 1, wherein forming said at least one sacrificial trench isolation is performed conjointly with forming shallow trench isolations configured to laterally isolate a well contained in the substrate.

5. The process according to claim 1, wherein performing said directional etch is implemented conjointly with performing an etch of a trench configured to accommodate a vertical gates of a buried transistor.

6. The process according to claim 5, wherein performing said etch of the trench configured to accommodate the vertical gate of the buried transistor is carried out in the semiconductor substrate.

7. The process according to claim 5, wherein forming said insulating cladding is performed conjointly with depositing a layer of gate oxide for said buried transistor.

8. The process according to claim 5, wherein filling said central section is performed conjointly with filling a gate material for said vertical gate of the buried transistor.

9. The process according to claim 1, wherein said directional etch is configured to etch the substrate to a first depth from a first side of the semiconductor substrate, and to etch said at least one electrode trench to a second depth from the first side, the second depth being equal to at least 125% of the first depth.

10. A process for fabricating a capacitive element in a semiconductor substrate, comprising:
    forming at least one sacrificial trench isolation in the semiconductor substrate;
    performing a directional etch that is configured to etch the semiconductor substrate to form at least one electrode trench, the directional etch being respectively aligned with said at least one sacrificial trench isolation and continuing depthwise into a portion of the semiconductor substrate which is located under said at least one sacrificial trench isolation;
    forming an insulating cladding on the flanks and bottom of said at least one electrode trench;
    filling a central section clad with said insulating cladding with a conductive material;
    wherein the conductive material of the central section forms at least one first portion of a first electrode of the capacitive element, wherein the semiconductor substrate thus forming at least one second portion of a second electrode of the capacitive element and wherein the insulating cladding forms at least one third portion of a dielectric region of the capacitive element;
    forming a first insulating layer on a first side of the semiconductor substrate above said at least one trench;
    forming a first conductive layer on the first insulating layer;
    forming a second insulating layer on the first conductive layer;
    forming a second conductive layer on the second insulating layer;
    electrically coupling the first conductive layer to the conductive material of said central section such that the first conductive layer and the conductive material of the central section form the first electrode of the capacitive element; and
    electrically coupling the second conductive layer to the substrate such that the second conductive layer and the substrate form the second electrode.

11. The process according to claim 10, wherein the first insulating layer and the second insulating layer forming, conjointly with the insulating cladding, said dielectric region of the capacitive element.

12. The process according to claim 10, wherein:
    forming the first insulating layer is performed conjointly with forming a layer of tunnel oxide of a floating-gate transistor;
    forming the first conductive layer is performed conjointly with forming a polysilicon layer of a floating gate of the floating-gate transistor;
    forming the second insulating layer is performed conjointly with forming an oxide layer of a control gate of the floating-gate transistor; and
    forming the second conductive layer is performed conjointly with forming a polysilicon layer of the control gate of the floating-gate transistor.

13. A process, comprising:
    forming first and second shallow trench isolation structures in a semiconductor substrate, each shallow trench isolation structure comprising a trench and an insulating material filling the trench;
    performing a directional etch that is configured to, in a single plasma etching operation: completely remove the insulating material from the trench of the first shallow trench isolation; extend the trench of the first shallow trench isolation to a deeper depth; and form a further trench in the semiconductor substrate, said further trench having a depth less than said deeper depth;
    wherein said second shallow trench isolation structure is positioned between the extended trench and the further trench;

forming an insulating cladding on the flanks and bottom of said extended trench and the further trench;

filling a central section of each of the extended trench and the further trench that are clad with said insulating cladding with a conductive material;

wherein the conductive material of the central section in said extended trench forms a first electrode of a capacitive element; and wherein the conductive material of the central section in said further trench forms a gate electrode of a transistor.

14. The process of claim 13, wherein the insulating material filling the trench is an oxide material.

15. The process of claim 13, wherein the trenches of the first and second shallow trench isolations have a first width, and wherein the extended trench has a second width that is greater than the first width.

16. The process of claim 13, wherein the insulating cladding forms a layer of gate oxide for said transistor.

17. The process of claim 13, wherein said deeper depth is equal to at least 125% of said depth of the further trench.

18. A process, comprising:
forming first and second shallow trench isolation structures in a semiconductor substrate, each shallow trench isolation structure comprising a trench and an insulating material filling the trench;

performing a directional etch that is configured to: remove the insulating material from the trench of the first shallow trench isolation; extend the trench of the first shallow trench isolation to a deeper depth; and form a further trench in the semiconductor substrate, said further trench having a depth less than said deeper depth;

wherein said second shallow trench isolation structure is positioned between the extended trench and the further trench;

forming an insulating cladding on the flanks and bottom of said extended trench and the further trench;

filling a central section of each of the extended trench and the further trench that are clad with said insulating cladding with a conductive material;

wherein the conductive material of the central section in said extended trench forms a first electrode of a capacitive element;

wherein the conductive material of the central section in said further trench forms a gate electrode of a transistor;

forming a first insulating layer above said extended trench;

forming a first conductive layer on the first insulating layer;

forming a second insulating layer on the first conductive layer;

forming a second conductive layer on the second insulating layer;

electrically coupling the first conductive layer to the conductive material of said central section in said extended trench such that the first conductive layer and the conductive material of the central section form the first electrode of the capacitive element; and electrically coupling the second conductive layer to the substrate such that the second conductive layer and the substrate form a second electrode of the capacitive element.

19. The process of claim 18, wherein the first insulating layer and the second insulating layer forming, conjointly with the insulating cladding, said dielectric region of the capacitive element.

20. The process of claim 18, wherein:
forming the first insulating layer is performed conjointly with forming a layer of tunnel oxide of a floating-gate transistor;

forming the first conductive layer is performed conjointly with forming a polysilicon layer of a floating gate of the floating-gate transistor;

forming the second insulating layer is performed conjointly with forming an oxide layer of a control gate of the floating-gate transistor; and forming the second conductive layer is performed conjointly with forming a polysilicon layer of the control gate of the floating-gate transistor.

* * * * *